(12) United States Patent
Colinge

(10) Patent No.: US 8,772,109 B2
(45) Date of Patent: Jul. 8, 2014

(54) APPARATUS AND METHOD FOR FORMING SEMICONDUCTOR CONTACTS

(71) Applicant: Taiwan Semiconductor Manufacturing Company, Ltd., Hsin-Chu (TW)

(72) Inventor: Jean-Pierre Colinge, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 10 days.

(21) Appl. No.: 13/659,836

(22) Filed: Oct. 24, 2012

(65) Prior Publication Data
US 2014/0110755 A1 Apr. 24, 2014

(51) Int. Cl.
H01L 21/336 (2006.01)
H01L 21/8238 (2006.01)
H01L 21/337 (2006.01)
H01L 29/66 (2006.01)

(52) U.S. Cl.
USPC ........... 438/269; 438/196; 438/212; 438/268; 257/192; 257/263

(58) Field of Classification Search
USPC ........... 438/196, 212, 268, 269; 257/192, 263
See application file for complete search history.

(56) References Cited

U.S. PATENT DOCUMENTS

2004/0219722 A1* 11/2004 Pham et al. .................... 438/157
2007/0257296 A1* 11/2007 Miyano ......................... 257/311
2008/0185650 A1* 8/2008 Chen et al. .................... 257/348
2008/0242024 A1* 10/2008 Sugioka ........................ 438/259
2012/0224438 A1* 9/2012 Inaba ..................... 365/189.011

OTHER PUBLICATIONS

Shayesteh, M., et al., "NiGe Contacts and Junction Architectures for P and As Doped Germanium Devices," IEEE Transactions on Electron Devices, vol. 58, No. 11, Nov. 2011, pp. 3801-3807.

Duffy, R., et al., "The formation, stability, and suitability of n-type junctions in germanium formed by solid phase epitaxial recrystallization," Applied Physics Letters 96, American Institute of Physics, Tyndall National Institute, Unviersity College Cork, Jun. 2010, 3 pages.

Shayesteh, M., et al., "N-typed Doped Germanium Contact Resistance Extraction and Evaluation for Advanced Devices," IEEE, Tyndall National Institute, University College Cork, 2011, pp. 235-238.

* cited by examiner

Primary Examiner — Karen Kusumakar
(74) Attorney, Agent, or Firm — Slater and Matsil, L.L.P.

(57) ABSTRACT

A method for forming semiconductor contacts comprises forming a germanium fin structure over a silicon substrate, depositing a doped amorphous silicon layer over the first drain/source region and the second drain/source region at a first temperature, wherein the first temperature is lower than a melting point of the germanium fin structure and performing a solid phase epitaxial regrowth process on the amorphous silicon layer at a second temperature, wherein the second temperature is lower than the melting point of the germanium fin structure.

12 Claims, 11 Drawing Sheets

APPARATUS AND METHOD FOR FORMING SEMICONDUCTOR CONTACTS

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a metal oxide semiconductor (MOS) field effect transistor (FET), active regions include a drain, a source, a channel region connected between the drain and the source, and a gate to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source.

As semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, multigate devices such as fin field effect transistors (FinFETs), trigate FETS, pi-gate or omega-gate FETs, gate-all-around (GAA) FETs and nanowire FETs have emerged as an effective alternative to further reduce leakage current in semiconductor devices. We will here use the word "FinFET" to describe multigate FETs in general. In a FinFET, an active region including a drain region, a channel region and a source region protrudes up from the surface of the semiconductor substrate upon which the FinFET is located. The active region of the FinFET, like a fin, is rectangular, trapezoidal or triangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

As semiconductor technologies further evolve, high speed integrated circuits are needed to maintain the electronic components' performance from one generation to the next. For example, semiconductor transistors formed by high carrier mobility materials such as III-V materials, germanium and/or the like are desirable for high density and high speed integrated circuits.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a method for forming drain/source contacts for a fin field effect transistor (FinFET) having an n-type germanium fin structure. The embodiments of the disclosure may also be applied, however, to a variety of semiconductor devices. Hereinafter, various embodiments will be explained in detail with reference to the accompanying drawings.

Figure 1:
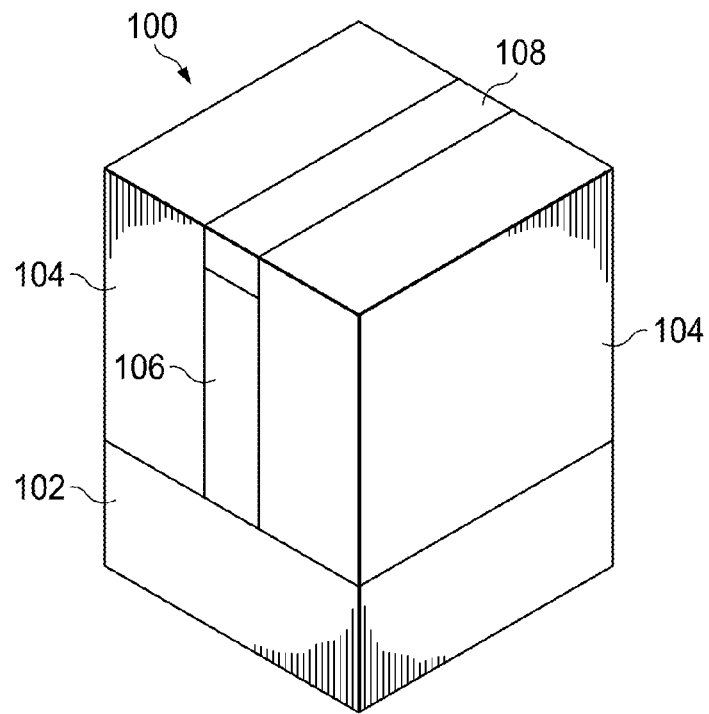
FIG. 1 illustrates a perspective view of a semiconductor device in accordance with an embodiment.

FIGS. 1-8 illustrates intermediate steps of fabricating drain/source contacts of a FinFET having an n-type germanium fin structure in accordance with an embodiment. FIG. 1 illustrates a perspective view of a semiconductor device in accordance with an embodiment. The semiconductor device 100 may comprise a substrate 102, an isolation region 104, a first semiconductor region 106 and a second semiconductor region 108. In accordance with an embodiment, the first semiconductor region 106 is a p-type silicon germanium region. The second semiconductor region 108 is an n-type germanium region. Throughout the description, the first semiconductor region 106 and the second semiconductor region 108 are alternatively referred to as the p-type silicon germanium region 106 and the n-type germanium region 108 respectively.

As shown in FIG. 1, the isolation region 104 is formed over the substrate 102. The p-type silicon germanium region 106 and the n-type germanium region 108 are formed over the substrate 102. More particularly, the p-type silicon germanium region 106 is formed between the substrate 102 and the n-type germanium region 108. Furthermore, both the p-type silicon germanium region 106 and the n-type germanium region 108 are embedded in the isolation region 104.

The substrate 102 may be a silicon substrate. Alternatively, the substrate 102 may comprise other semiconductor materials such as germanium, compound semiconductor materials such as silicon carbide, gallium arsenide, indium arsenide, indium phosphide, any combination thereof and/or the like. In accordance with an embodiment, the substrate 102 may be a crystalline structure. In accordance with another embodiment, the substrate 102 may be a silicon-on-insulator (SOI) substrate.

In accordance with an embodiment, the isolation region 104 may be implemented by using a shallow trench isolation (STI) structure. The STI structures (e.g., isolation region 104) may be fabricated by using suitable techniques including photolithography and etching processes. In particular, the photolithography and etching processes may comprise depositing a commonly used mask material such as photoresist over the substrate 102, exposing the mask material to a pattern, etching the substrate 102 in accordance with the pattern. In this manner, a plurality of openings may be formed as a result. The openings are then filled with dielectric materials to form the STI structures (e.g., isolation region 104). A chemical mechanical polishing (CMP) process is then performed to remove excess portions of the dielectric materials, and the remaining portions are the isolation region 104.

The first semiconductor region 106 may be formed of a different semiconductor material from the substrate 102. The first semiconductor region 106 may be grown in an opening (not shown) surrounded by the isolation region 104. In accordance with embodiment, the first semiconductor region 106 may be formed of p-type silicon germanium, which may be expressed as $Si_{1-x}Ge_x$, wherein x is the atomic percentage of germanium in the silicon germanium region, and may be greater than 0 and equal to or less than 1. When x is equal to 1, the first semiconductor region 106 may be formed of pure germanium. In accordance with another embodiment, the first semiconductor region 106 may be formed of a compound semiconductor material comprising group III and group V elements, or a compound material comprising group II and group VI elements.

In accordance with another embodiment, the second semiconductor region 108 may comprise n-type germanium. The second semiconductor region 108 may be formed by a selective epitaxial growth (SEG) process.

Figure 2:
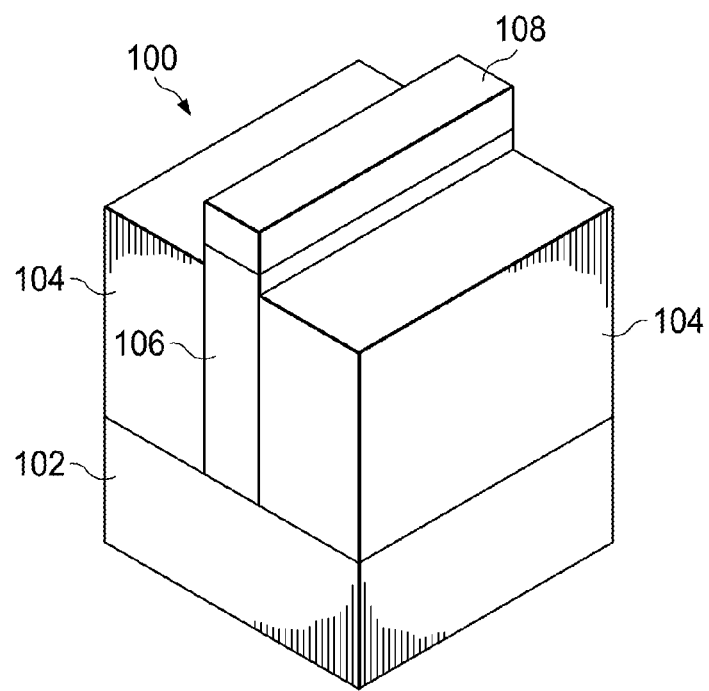
FIG. 2 illustrates a perspective view of the semiconductor device shown in FIG. 1 after an etching process is applied to the top surfaces of the isolation regions in accordance with an embodiment.

FIG. 2 illustrates a perspective view of the semiconductor device shown in FIG. 1 after an etching process is applied to the top surfaces of the isolation regions in accordance with an embodiment. In order to form a fin structure over the substrate 102, the upper portions of the isolation region 104 are etched away. As shown in FIG. 2, the etching process is performed on the isolation region 104 until the n-type germanium region 108 is fully exposed. It should be noted that the fin structure shown in FIG. 2 includes a channel region, a first drain/source region and a second drain/source region of a FinFET. The detailed formation process of the channel region, the first drain/source region and the second drain/source region will be described below with respect to FIG. 3.

Figure 3:
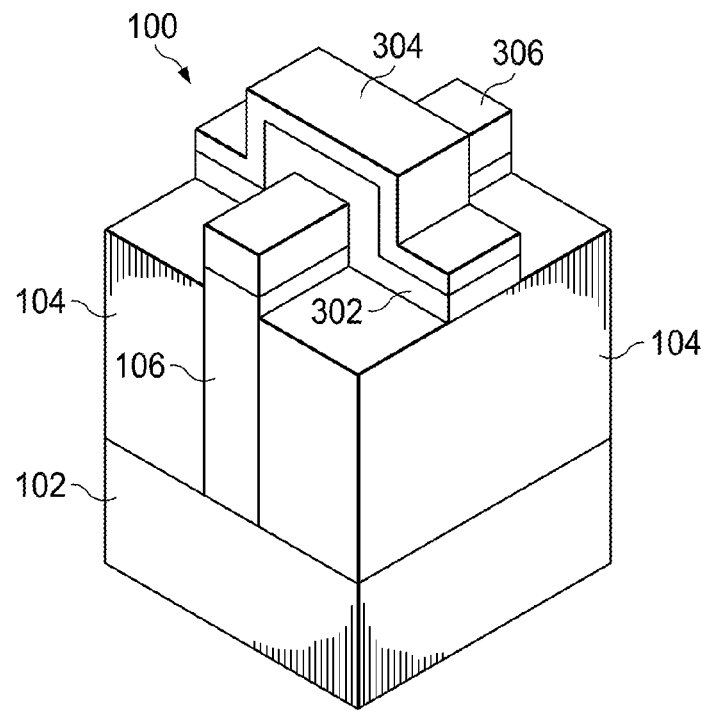
FIG. 3 illustrates a perspective view of the semiconductor device shown in FIG. 2 after a gate dielectric layer, a gate electrode layer and a cap layer are formed over the fin structure in accordance with an embodiment.

FIG. 3 illustrates a perspective view of the semiconductor device shown in FIG. 2 after a gate dielectric layer, a gate electrode layer and a cap layer are formed over the fin structure in accordance with an embodiment. A gate dielectric layer (not shown) is deposited over the semiconductor device. Subsequently, a gate electrode layer 302 is deposited over the gate dielectric layer. Through a suitable patterning process, a gate structure as shown in FIG. 3 is formed. As shown in FIG. 3, the gate structure including the gate dielectric layer and the gate electrode layer 302 wraps the channel region of the fin structure around three sides. There may be a cap layer 304 formed over the gate structure. In accordance with an embodiment, the cap layer 304 functions as a spacer layer.

The gate dielectric layer may comprise a material such as silicon dioxide, silicon oxynitride and/or the like. Alternatively, the gate dielectric layer may alternatively be formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, multi-layers thereof and/or the like. The gate dielectric layer may be formed by any suitable fabrication techniques such as thermal oxidation, chemical vapor deposition (CVD), sputtering and/or the like.

The gate electrode layer 302 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In accordance with an embodiment, the gate electrode layer 302 is formed of poly-silicon. The gate electrode layer 302 may be formed by depositing doped or undoped polysilicon by low-pressure chemical vapor deposition (LPCVD) to a thickness in the range of about 400 Å to about 2,400 Å. The gate may be formed using a gate-last process using sacrificial polysilicon. In this technique, the polysilicon and the gate oxide are removed after source and drain formation and new gate dielectric layer and gate metal layers are deposited.

Once the gate electrode layer 302 and the cap layer 304 are formed over the gate dielectric layer, a patterning process may be performed on the gate electrode layer 302, the cap layer 304 and the gate dielectric layer to form the gate structure shown in FIG. 3. The gate patterning process may be accomplished by depositing mask material (not shown) such as photoresist or silicon oxide over the gate electrode layer. The mask material is then patterned. Furthermore, the gate electrode layer, the cap layer and the gate dielectric layer are etched in accordance with the pattern. The gate electrode layer 302, the cap layer 304 and the gate dielectric layer may be etched using plasma etching to form the patterned gate structure as illustrated in FIG. 3.

The drain/source regions (e.g., the first drain/source region 306) may be doped by performing an implanting process to implant appropriate dopants. For example, in order to fabricate an n-channel transistor, n-type dopants such as phosphorous, arsenic, antimony, or the like may be implanted. The drain/source regions may be implanted using the gate structure as a mask.

It should be noted that the gate structure shown in FIG. 3 can be formed by either a gate first technique or a gate last technique. For example, in the formation of the semiconductor device 100, both gate-first and gate-last methods may be applicable. In the gate-first methods, the gate structure of the transistor may be formed before the formation of the source and drain regions. In the gate-last methods, a dummy gate of the transistor may be formed, followed by the formation of the source and drain regions. The dummy gate of the transistor is then removed and replaced with a new gate, which may be a metal gate.

Figure 4:
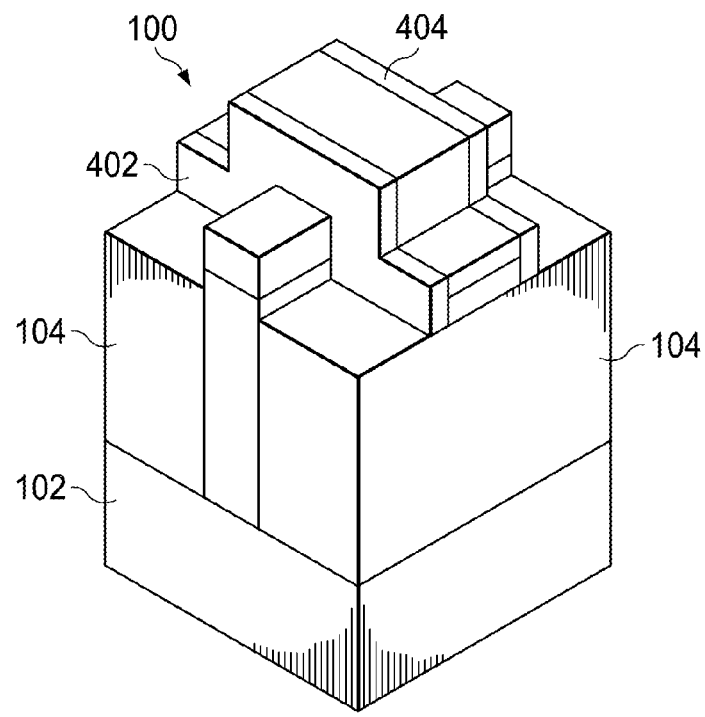
FIG. 4 illustrates a perspective view of the semiconductor device shown in FIG. 3 after gate spacers are formed on opposite sides of the gate structure in accordance with an embodiment.

FIG. 4 illustrates a perspective view of the semiconductor device shown in FIG. 3 after gate spacers are formed on opposite sides of the gate structure in accordance with an embodiment. The gate spacers 402 and 404 may be formed by blanket depositing a spacer layer (not shown) on the gate structure. The spacer layer may be formed of any suitable materials including SiN, oxynitride, SiC, SiON, oxide, any combinations thereof and/or the like.

The gate spacer layer (not shown) may be formed by any suitable semiconductor fabrication techniques such as CVD, PECVD, sputtering and/or the like. The gate spacer layer is then patterned by suitable etching techniques. As a result, two lateral spacers (e.g., spacers 402 and 404) are formed on opposite sides of the gate structure.

Figure 5:
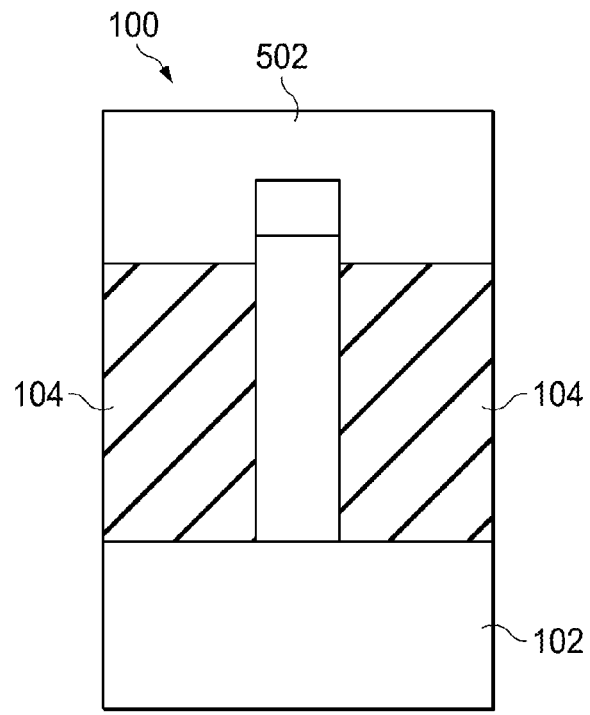
FIG. 5 illustrates a cross sectional view of the semiconductor device shown in FIG. 4 after an amorphous silicon layer is deposited over the semiconductor device in accordance with an embodiment.

FIG. 5 illustrates a cross sectional view of the semiconductor device shown in FIG. 4 after an amorphous silicon layer is deposited over the semiconductor device in accordance with an embodiment. The silicon is deposited in an amorphous state over the top surface of the semiconductor device 100. As a result, an amorphous silicon layer 502 is formed over the semiconductor device 100 as shown in FIG. 5.

In accordance with an embodiment, the amorphous silicon layer 502 is formed of N+ doped amorphous silicon. Alternatively, the amorphous silicon layer 502 may be formed of a mixture between silicon and germanium. The amorphous silicon layer 502 may be formed by CVD, PECVD, LPCVD and/or the like. The amorphous silicon layer 502 may be deposited using silicon hydride ($SiH_4$, $Si_2H_6$, $Si_3H_8$ or $Si_4H_{10}$), or using silicon hydride and a doping gas such as PH3. The amorphous silicon layer 502 may be deposited under a temperature in a range of about 550 degrees to about 600 degrees centigrade.

Figure 6:
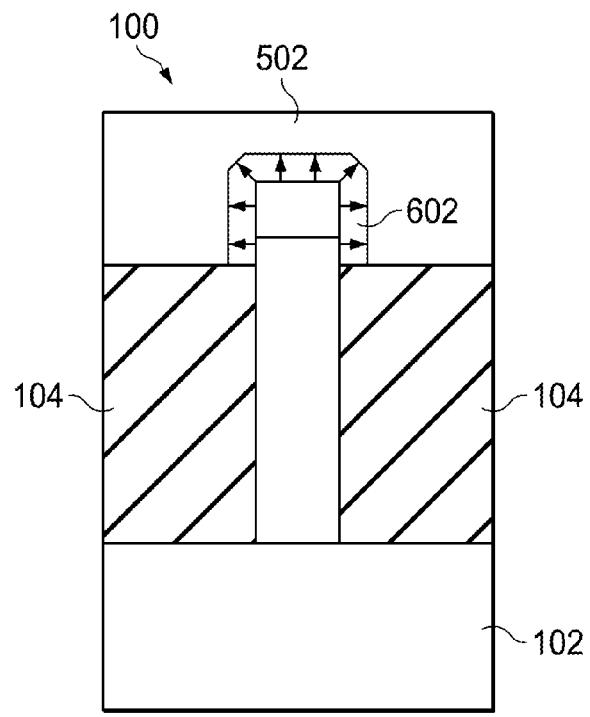
FIG. 6 illustrates a cross sectional view of the semiconductor device shown in FIG. 5 after a solid phase epitaxial regrowth process is performed on the some of the amorphous silicon layer in accordance with an embodiment.

FIG. 6 illustrates a cross sectional view of the semiconductor device shown in FIG. 5 after a solid phase epitaxial regrowth process is performed on the amorphous silicon layer in accordance with an embodiment. The amorphous silicon layer 502 is regrown through a solid phase epitaxial regrowth process. In the regrown process, a crystal silicon layer 602 is formed. In accordance with an embodiment, the crystal silicon layer 602 is an n-type silicon layer.

The crystal silicon layer 602 may be grown up to the top surface of the amorphous layer 502. Alternatively, by controlling the strength and time of the regrown process, only a portion of the amorphous layer 502 is crystallized to form the crystal silicon layer 602. In accordance with an embodiment, the thickness of the crystal silicon layer 602 is about 10 nm. The regrowth process is performed at a temperature in a range from about 620 degrees to about 650 degrees centigrade. The solid phase epitaxial regrowth duration is in a range from about one minute to about thirty minutes.

One advantageous feature of forming the crystal silicon layer 602 by depositing an amorphous silicon layer and performing a solid phase epitaxial regrowth process on the amorphous silicon layer is that the fabrication steps of FIG. 5 and FIG. 6 may be performed under a low temperature (e.g., lower than 650 degrees), which is compatible with the temperature requirements of germanium fabrication processes.

Another advantageous feature of having an n-type silicon layer (e.g., crystal silicon layer 602) is that the germanium drain/source region and the crystal silicon layer 602 may be the same conduction band energy. As such, a barrier may not be formed between the germanium drain/source region and the crystal silicon layer 602. Such a barrier-less structure helps to reduce the contact resistance of the drain/source regions of the semiconductor device 100.

Figure 7:
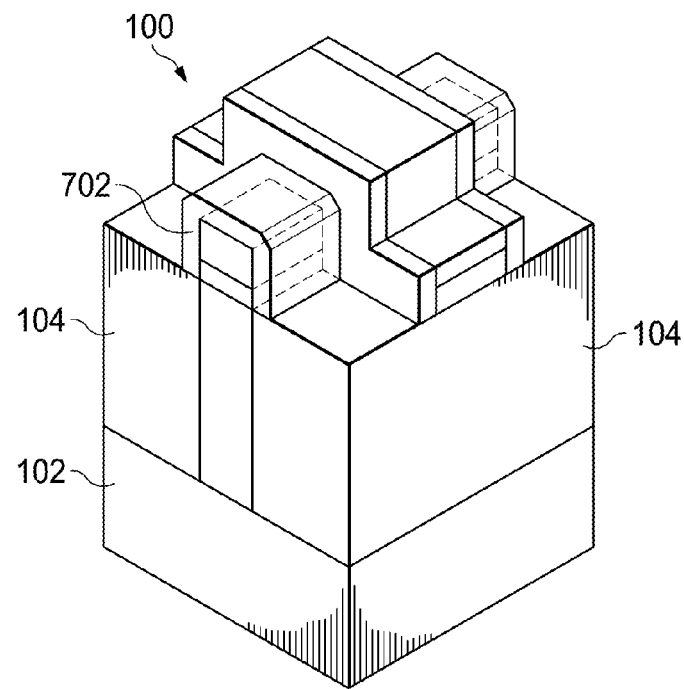
FIG. 7 illustrates a perspective view of the semiconductor device shown in FIG. 6 after the remaining amorphous layer is removed in accordance with an embodiment.

FIG. 7 illustrates a perspective view of the semiconductor device shown in FIG. 6 after the remaining amorphous layer is removed in accordance with an embodiment. The remaining amorphous layer 502 may be removed by using suitable etching technique such as wet etching. As shown in FIG. 7, the epitaxially regrown region 702 is formed over the drain/source region of the semiconductor device. More particularly, the epitaxially regrown region 702 wraps the drain/source region around several sides. One advantageous feature of having the epitaxially regrown region 702 is that the epitaxially regrown region 702 is formed of n-type silicon, which helps to provide good contact to drain/source regions, which are formed of n-type germanium.

Figure 8:
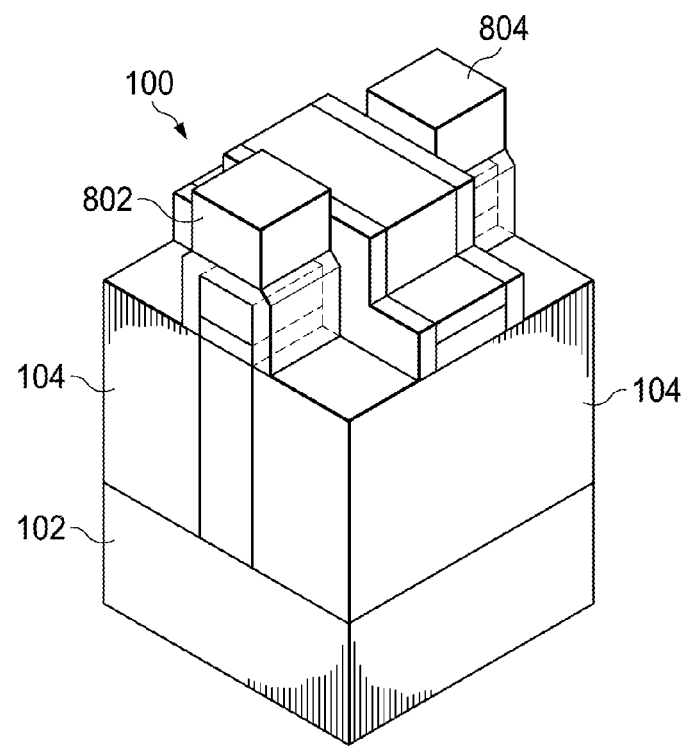
FIG. 8 illustrates a perspective view of the semiconductor device shown in FIG. 7 after drain/source contacts are formed over the epitaxially regrown region in accordance with an embodiment.

FIG. 8 illustrates a perspective view of the semiconductor device shown in FIG. 7 after drain/source contacts are formed over the epitaxially regrown region in accordance with an embodiment. The drain/source contacts 802 and 804 may comprise a barrier/adhesion layer (not shown). In accordance with an embodiment, the barrier layer may be formed of one or more layers of titanium, titanium nitride, tantalum, tantalum nitride, or the like. The barrier layer may be formed through CVD, although other techniques could alternatively be used. The barrier layer is preferably formed to a combined thickness of about 50 Å to about 500 Å.

The drain/source contacts 802 and 804 may be formed of any suitable conductive material, such as a highly-conductive, low-resistive metal, elemental metal, alloy metal, or the like. In accordance with an embodiment, the drain/source contacts 802 and 804 are formed of a conductive material including a metal (e.g., tantalum, titanium, molybdenum, tungsten, platinum, aluminum, hafnium, ruthenium) and/or a metal silicide (e.g., titanium silicide, cobalt silicide, nickel silicide, tantalum silicide). The drain/source contacts 802 and 804 are formed of by using suitable deposition techniques such as CVD and/or the like.

Figure 9:
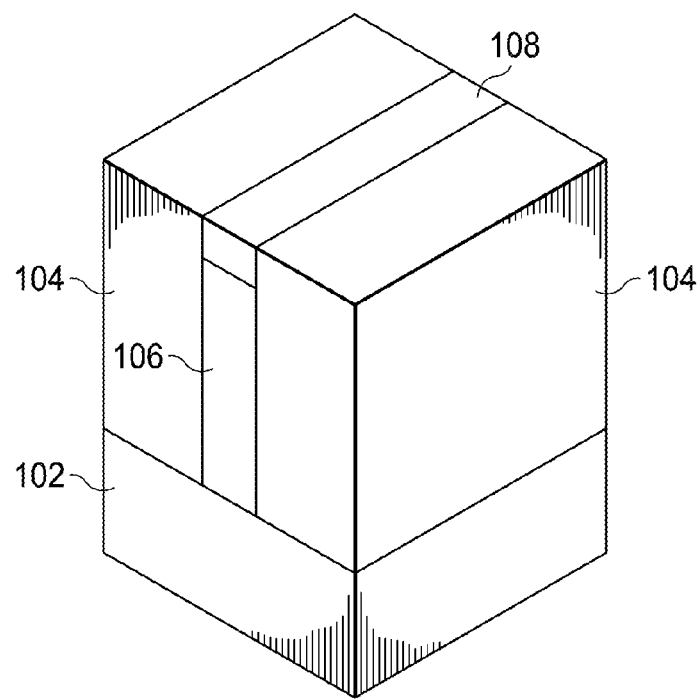
FIGS. 9-15 illustrates intermediate steps of fabricating drain/source contacts of a FinFET having an n-type germanium fin structure in accordance with another embodiment.
Figure 10:
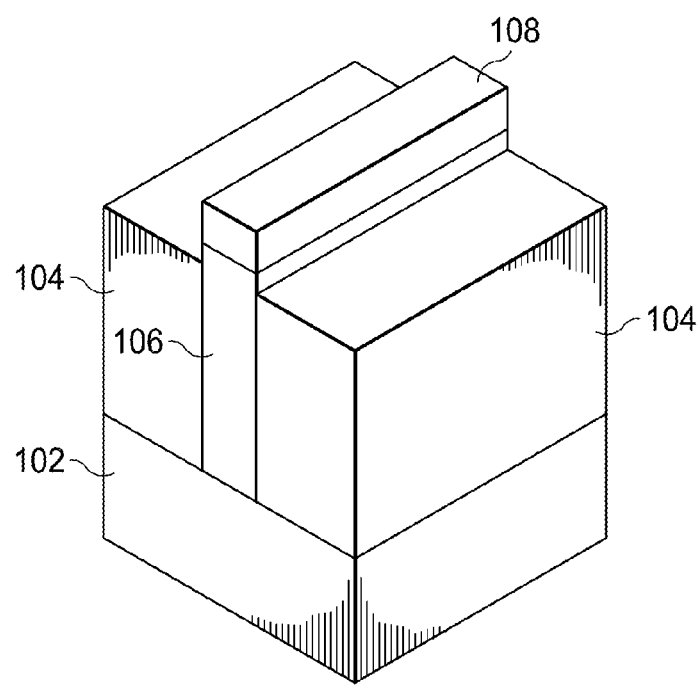
Figure 11:
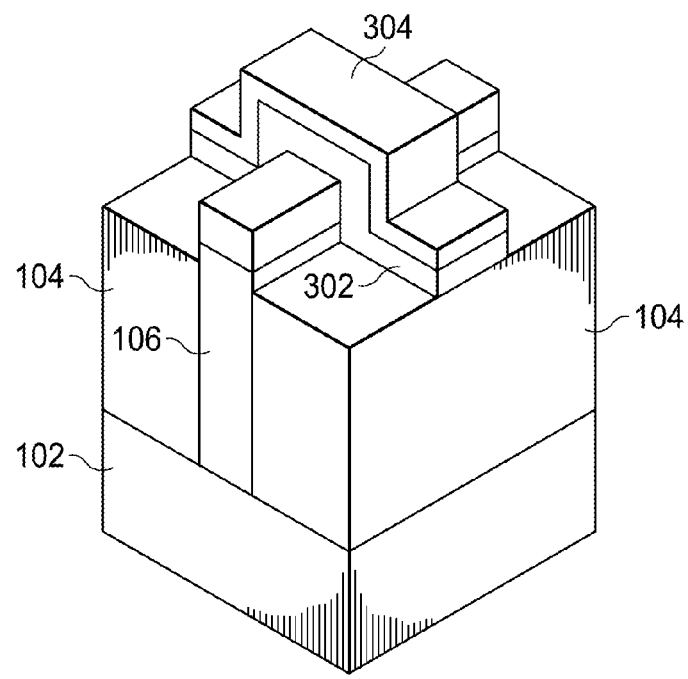

FIGS. 9-15 illustrates intermediate steps of fabricating drain/source contacts of a FinFET having an n-type germanium fin structure in accordance with another embodiment. The fabrication steps shown in FIGS. 9-11 are similar to the fabrication steps shown in FIGS. 1-3, and hence are not discussed herein to avoid repetition.

Figure 12:
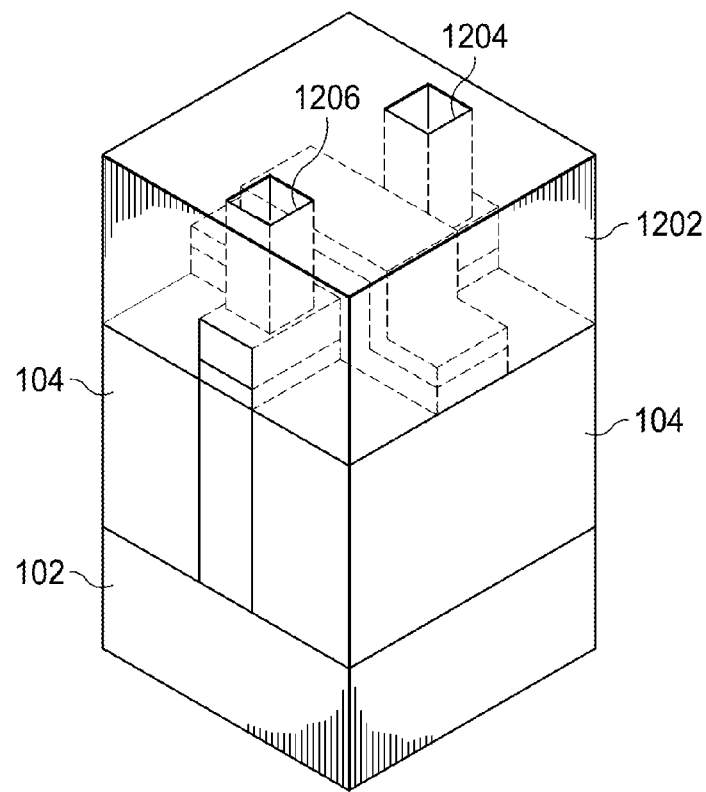

FIG. 12 illustrates a perspective view of the semiconductor device shown in FIG. 11 after an inter-layer dielectric (ILD) layer is formed over the semiconductor device and two openings are formed in the ILD layer in accordance with an embodiment. The ILD layer 1202 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof and/or the like. The ILD layer 120 may be formed by using any suitable deposition method known in the art, such as spinning, CVD, PECVD and/or the like.

The openings 1204 and 1206 may be formed by using suitable fabrication techniques. For example, a photoresist material layer (not shown) is deposited over the ILD layer 1202. The photoresist material layer is exposed and developed to expose the portions above the first drain/source region and the second drain/source region of the semiconductor device. An etching process may be performed on the exposed ILD layer until upper surfaces of the fin structure containing the source/drain regions are exposed.

Figure 13:
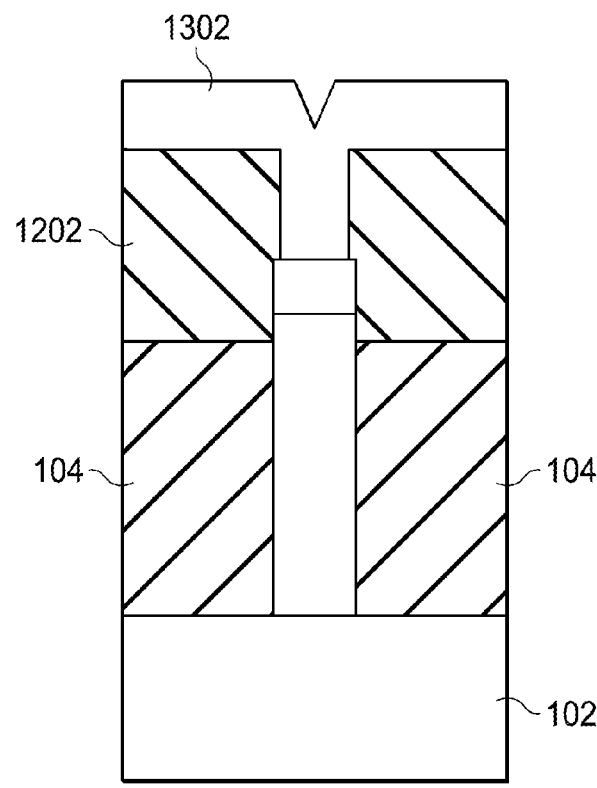

FIG. 13 illustrates a cross sectional view of the semiconductor device shown in FIG. 12 after an amorphous silicon layer is deposited over the semiconductor device in accordance with an embodiment. The amorphous silicon fills the openings over the drain/source regions as well as the top surface of the ILD layer 1202. The amorphous silicon layer 1302 is formed of N+ doped amorphous silicon. Alternatively, the amorphous silicon layer 1302 may be formed of a mixture between silicon and germanium. The amorphous silicon layer 1302 may be formed by CVD, PECVD, LPCVD and/or the like.

Figure 14:
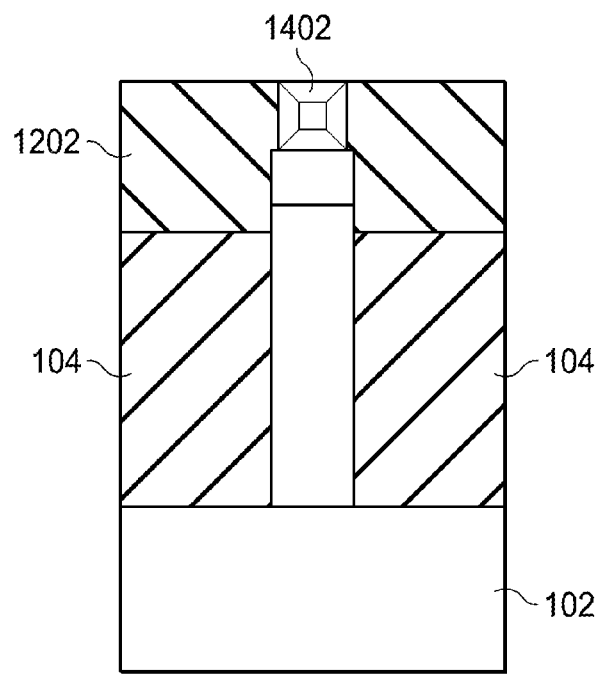

FIG. 14 illustrates a cross sectional view of the semiconductor device shown in FIG. 13 after a solid phase epitaxial regrowth process is performed on the semiconductor device in accordance with an embodiment. The solid phase epitaxial regrowth process of FIG. 14 is similar to that described above with respect to FIG. 6, and hence is not discussed again to avoid repetition. A chemical mechanical polish (CMP) process may be applied to the top surface of the ILD layer to remove excess ILD and amorphous silicon materials. It should be noted that the shape of the N+ silicon region 1402 is slightly different from the shape of the N+ silicon region 702 shown in FIG. 7. In particular, the N+ silicon region 1402 is formed directly over the drain/source region.

Figure 15:
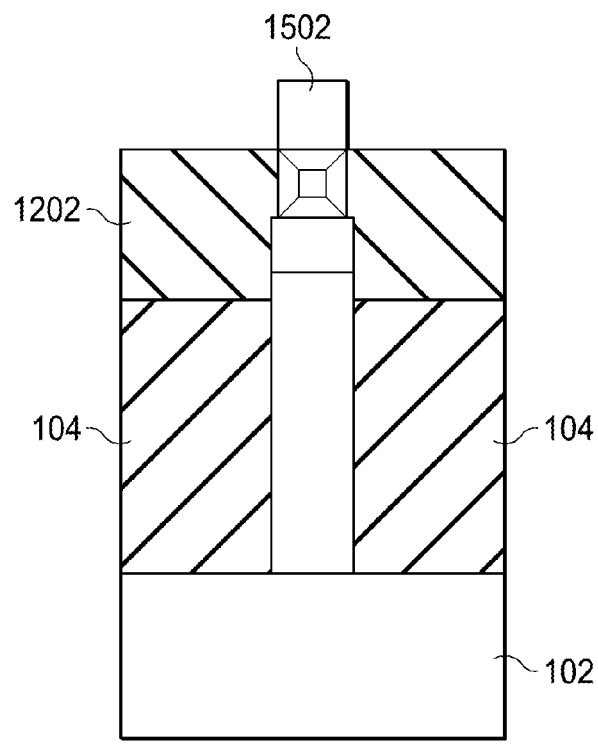
Figure 16:
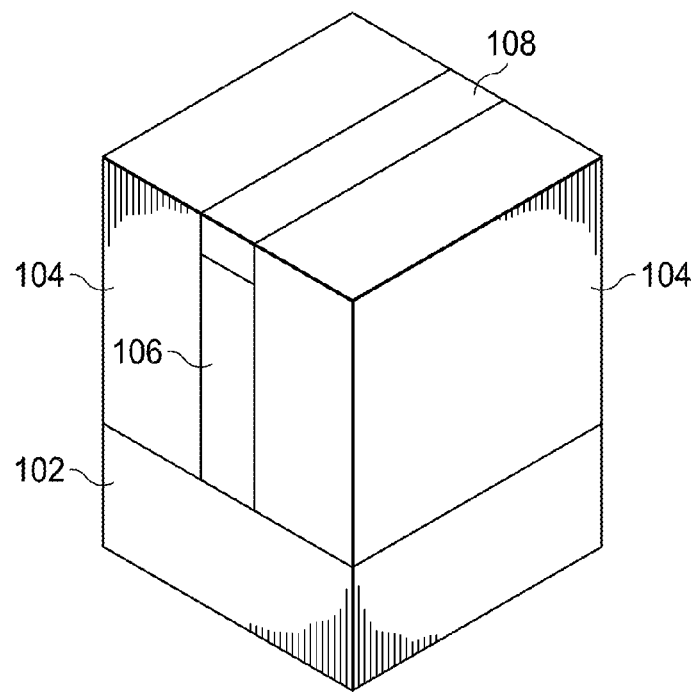
FIGS. 16-22 illustrates intermediate steps of fabricating drain/source contacts of a FinFET having an n-type germanium fin structure in accordance with yet another embodiment.
Figure 17:
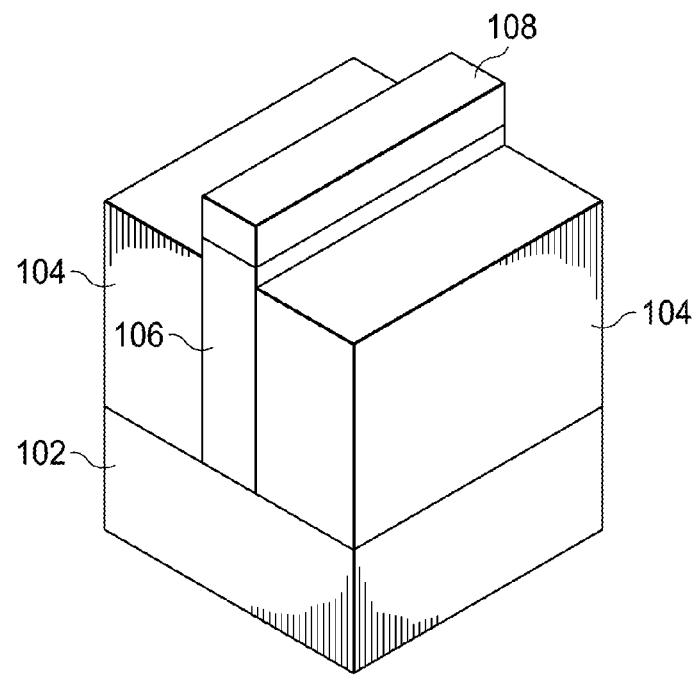
Figure 18:
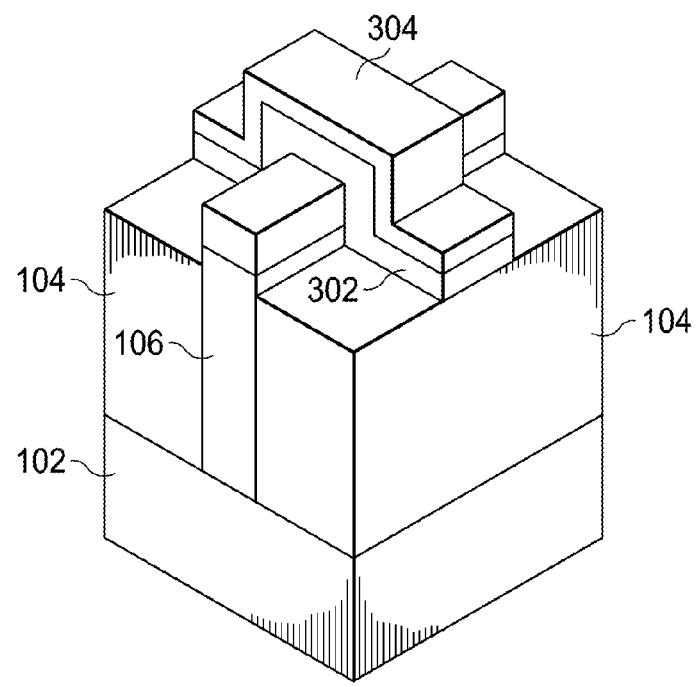
Figure 19:
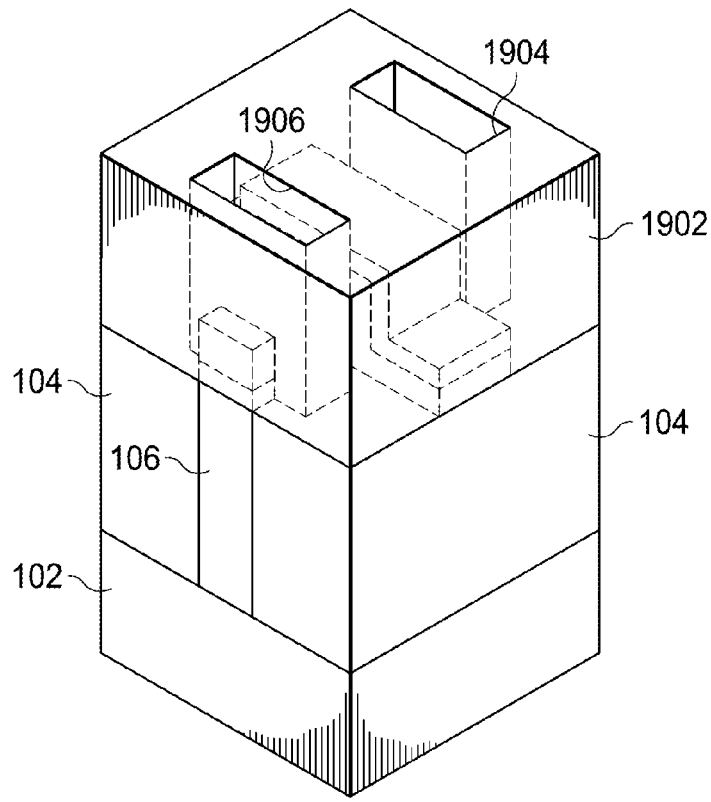
Figure 20:
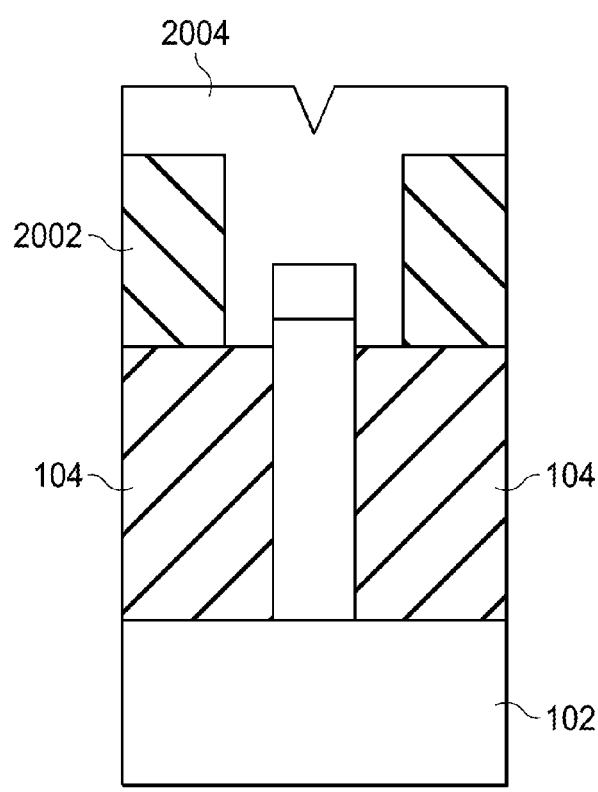
Figure 21:
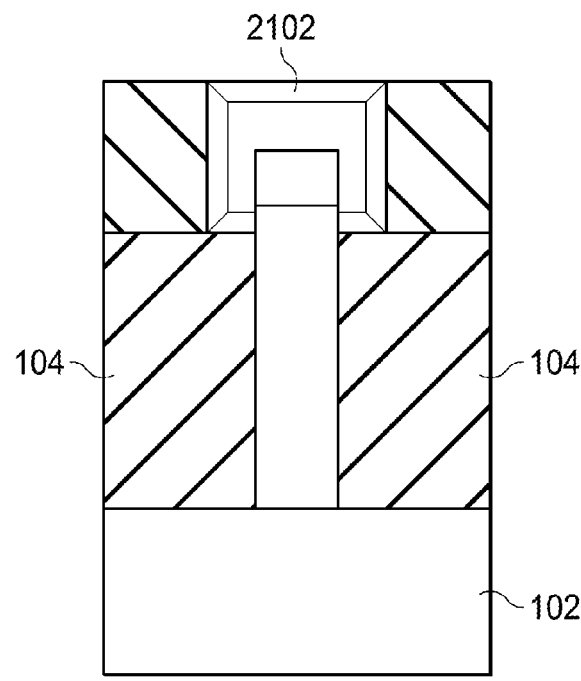
Figure 22:
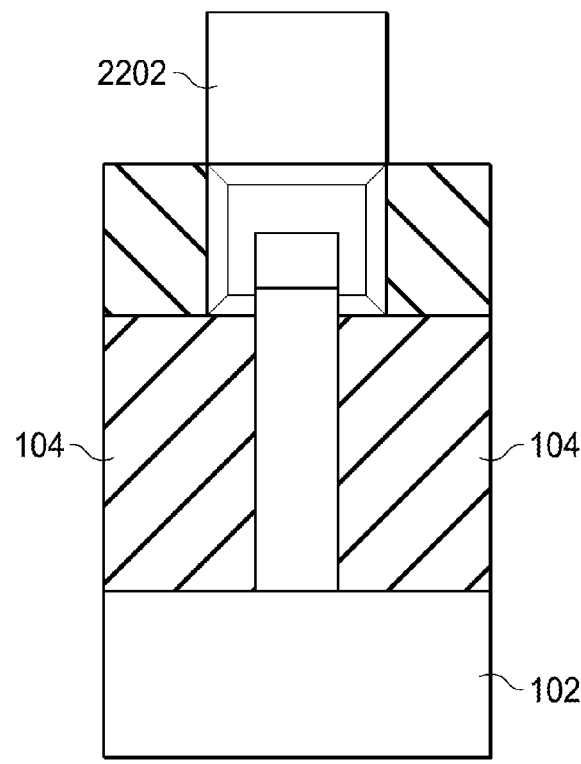

FIG. 15 illustrates a cross sectional view of the semiconductor device shown in FIG. 14 after a drain/source contact is formed over the N+ silicon region in accordance with an embodiment. The formation process and the material of the drain/source contact of FIG. 15 is similar to that shown in FIG. 8, and hence is not discussed again to avoid unnecessary repetition.

FIGS. 16-22 illustrates intermediate steps of fabricating drain/source contacts of a FinFET having an n-type germanium fin structure in accordance with yet another embodiment. The fabrication steps shown in FIGS. 16-22 are similar to the fabrication steps shown in FIGS. 9-15 except that in FIG. 19, the openings 1904 and 1906 are wider than the width of the drain/source regions. As a result, the N+ silicon region 2102 wraps the drain/source region around three sides rather than one side as shown in FIG. 14.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
forming a germanium fin structure over a silicon substrate, wherein the germanium fin structure comprises:
a channel connected between a first drain/source region and a second drain/source region;
depositing an N+ amorphous silicon layer over the first drain/source region and the second drain/source region at a first temperature, wherein the first temperature is lower than a melting point of the germanium fin structure; and
performing a solid phase epitaxial regrowth process on the amorphous silicon layer at a second temperature, wherein the second temperature is lower than the melting point of the germanium fin structure.

2. The method of claim 1, wherein:
the first temperature is in a range from about 550 degrees to about 600 degrees.

3. The method of claim 1, wherein:
the second temperature is in a range from about 620 degrees to about 650 degrees.

4. The method of claim 1, further comprising:
depositing an inter-layer dielectric (ILD) layer over the substrate, wherein the germanium fin structure is embedded in the ILD layer;
forming a first opening over the first drain/source region in the ILD layer;
forming a second opening over the second drain/source region in the ILD layer;
filling the first opening and the second opening with N+ amorphous silicon;
performing a solid phase epitaxial regrowth process on N+ amorphous silicon to form a N+ silicon region; and
performing a CMP process on the ILD layer until the N+ silicon region is exposed.

5. The method of claim 4, wherein:
the N+ silicon region wraps the first drain/source region around three sides.

6. The method of claim 4, wherein:
the N+ silicon region is formed over the first drain/source region.

7. A method comprising:
forming a germanium fin over a silicon substrate, wherein the germanium fin comprises:
a first drain/source region;
a second drain/source region; and
a channel coupled between the first drain/source region and the second drain/source region;
forming a gate structure over the channel, wherein the gate structure comprises:
a gate dielectric layer; and
a gate electrode layer formed over the gate dielectric layer;
depositing a first amorphous silicon layer over the first drain/source region at a first temperature;
depositing a second amorphous silicon layer over the second drain/source region at a second temperature; and
performing a solid phase epitaxial regrowth process on the first amorphous silicon layer and the second amorphous silicon layer at a third temperature.

8. The method of claim 7, wherein:
the first temperature is in a range from about 550 degrees to about 600 degrees;
the second temperature is in a range from about 550 degrees to about 600 degrees; and
the third temperature is in a range from about 620 degrees to about 650 degrees.

9. The method of claim 7, further comprising:
depositing an inter-layer dielectric (ILD) layer over the substrate, wherein the first drain/source region and the second drain/source region are embedded in the ILD layer;
forming a first opening over the first drain/source region, wherein the first opening is of a dimension approximately equal to a dimension of the first drain/source region;
forming a second opening over the second drain/source region, wherein the second opening is of a dimension approximately equal to a dimension of the second drain/source region;
depositing amorphous silicon in the first opening and the second opening; and
performing a solid phase epitaxial regrowth process on the amorphous silicon.

10. The method of claim 7, further comprising:
depositing an inter-layer dielectric (ILD) layer over the substrate, wherein the first drain/source region and the second drain/source region are embedded in the ILD layer;
forming a first opening over the first drain/source region, wherein the first opening is of a dimension greater than a dimension of the first drain/source region;
forming a second opening over the second drain/source region, wherein the second opening is of a dimension greater than a dimension of the second drain/source region;
depositing amorphous silicon in the first opening and the second opening; and
performing a solid phase epitaxial regrowth process on the amorphous silicon.

11. The method of claim 10, further comprising:
after the step of performing a solid phase epitaxial regrowth process on the amorphous silicon, applying a CMP process to the ILD layer; and
forming a first N+ silicon structure over the first drain/source region, wherein the first N+ silicon structure wraps the first drain/source region around three sides; and
forming a second N+ silicon structure over the second drain/source region, wherein the second N+ silicon structure wraps the second drain/source region around three sides.

12. The method of claim 11, further comprising:
forming a first metal contact over the first N+ silicon structure; and
forming a second metal contact over the second N+ silicon structure.

* * * * *